United States Patent

Neumann et al.

[11] Patent Number: 4,524,717
[45] Date of Patent: Jun. 25, 1985

[54] ELECTRON BEAM STRIP-COATING APPARATUS

[75] Inventors: Manfred Neumann; Siegfried Schiller; Gerhard ZeiBig; Henry Morgner; Günter Jäsch, all of Dresden, German Democratic Rep.

[73] Assignee: Bakish Materials Corp., Englewood, N.J.

[21] Appl. No.: 485,650

[22] Filed: Apr. 18, 1983

[30] Foreign Application Priority Data

Apr. 20, 1982 [DD] German Democratic Rep. ... 239121

[51] Int. Cl.³ .............................. C23C 13/10
[52] U.S. Cl. .................... 118/718; 118/726; 219/121 EE; 219/121 EV
[58] Field of Search ............ 118/726, 727, 718; 427/42; 219/121 EF, 121 EG, 121 ER, 121 ES, 121 ET, 121 EE, 121 EV; 373/11, 13, 14, 16

[56] References Cited

U.S. PATENT DOCUMENTS

| 3,303,320 | 2/1967 | Muller | 118/726 X |
| 3,394,217 | 7/1968 | Fisk | 118/726 X |
| 3,432,335 | 3/1969 | Schiller et al. | 219/121 EV |
| 3,562,141 | 2/1971 | Morley | 219/121 EE X |
| 3,931,490 | 1/1976 | Grothe et al. | 118/726 X |
| 4,061,871 | 12/1977 | Sommerkamp et äl. | 219/121 EFX |

FOREIGN PATENT DOCUMENTS 53-10953  4/1978  Japan ........................ 427/42

Primary Examiner—John D. Smith
Assistant Examiner—Bernard F. Plantz
Attorney, Agent, or Firm—Nolte, Nolte and Hunter

[57] ABSTRACT

The present invention is a coating apparatus for temperature-sensitive broad strips or similar substrates. To obtain a high quality of coating, it is necessary to minimize the path of the electron beam (EB) through the vapor cloud, and to keep away backscattered electrons from the evaporating material. According to the invention, this problem is solved by assembling a sector field with a vertical field direction at the deflection system connected with the EB gun, which is followed by a deflection field with a horizontal field direction. The divergent electron beam is guided in lines to the evaporating material by the geometry of the fields.

10 Claims, 3 Drawing Figures

ELECTRON BEAM STRIP-COATING APPARATUS

BACKGROUND OF THE INVENTION

The present invention is an apparatus for electron-beam coating of broad strips by means of an evaporation crucible, which extends across the direction of the running strip. This arrangement is especially suited for coating temperature-sensitive strips, such as paper or plastic, with a high uniformity of film thickness. The invention is suitable for the coating of other substrates, as well.

PRIOR ART

As is known, broad strips are coated onto substrates in a vacuum with electron beams. Compared with other deposition techniques, electron-beam coating offers the advantage of a higher deposition rate, the possibility of using materials with a high melting temperature and, if uncooled crucibles are used, the advantage of a high energetic efficiency.

Arrangements for electron-beam coating of broad strips used heretofore are either line evaporators with an electron beam deflected according to a program, or point evaporators with several electron beams.

In the case of line evaporators, an electron beam generated in an electron-beam gun (EB gun) is guided in a line across the surface of a large evaporation crucible, by means of electro-magnetic deflection systems, in accordance with a certain program, so that the desired distribution of the vapor density over the breadth of the strip to be coated is gained.

If point evaporators are used, several side-by-side electron beams impinge upon one or several evaporation crucibles.

The distribution of the vapor density over the strip breadth results from the superposition of the vapor density distributions of the beam incidence points placed side by side perpendicularly to the direction of the strip run.

Compared with line evaporators, the point evaporators have the following essential disadvantages: Several point evaporators placed side by side result, in principle, in more variation of film thickness. Also, the necessity of several EB guns raises costs. Furthermore, the failure probability of an individual EB gun raises the failure rate of the whole installation.

Variants are known for the design of line evaporators that are favorable in principle. Generally, an evaporation crucible extends over the whole breadth of the strip to be coated, and a high-power electron beam is guided in lines across the surface of the crucible according to a certain deflection program. It is known to inject the electron beam approximately perpendicularly to the direction of the strip run, between the evaporation crucible and the strip, and to deflect it onto the surface of the evaporator by a magnetic field in the direction of the strip run. The disadvantage of this is that, to reach the whole crucible area, the electron beam has to cover different distances in the space that includes vapor particles and, thus, it is attenuated to varying degrees. Also, the magnetic field can not be raised to a value that would insure deflection of the backscattered electrons, because the primary electron beam also would be deflected so much that it could not reach the opposite side of the evaporation crucible.

Another variant is designed to inject the electron beam in the approximate direction of the strip run, between the strip and the evaporation crucible, and to deflect it to the crucible by a magnetic field directed perpendicularly to the strip run. The advantage of this is that the path of the electron beam inside the space with vapor particles is essentially shorter, and almost equal for all points of the crucible surface. However, as in the previous case, the magnetic field can't be raised to insure that backscattered electrons are deflected, because for larger strip breadth the magnetic field would have such a large special extension that the primary electron beam between the EB gun and the evaporation crucible would again be deflected too much.

OBJECTS OF THE INVENTION

It is a general object of the present invention to avoid the disadvantages set forth above, and to provide an apparatus for electron-beam coating of broad strips that guarantees a highly uniform film thickness and a low thermal load on the substrate, with a simple design of high reliability.

A further object of the invention is to provide electon beam coating apparatus wherein the beam path through the vapor is short, and approaches equal path length across the crucible.

Another object of the present invention is to provide electron beam coating apparatus including separate magnetic fields for beam deflection and backscatter prevention, the latter being strong enough to insure complete deflection.

Various other objects and advantages of the invention will become apparent in the following description of embodiments, and the novel features will be particularly pointed out in connection with the appended claims.

THE DRAWINGS

Reference will hereinafter be made to the accompanying drawings, wherein.

DESCRIPTION OF EMBODIMENTS

Figure 1:
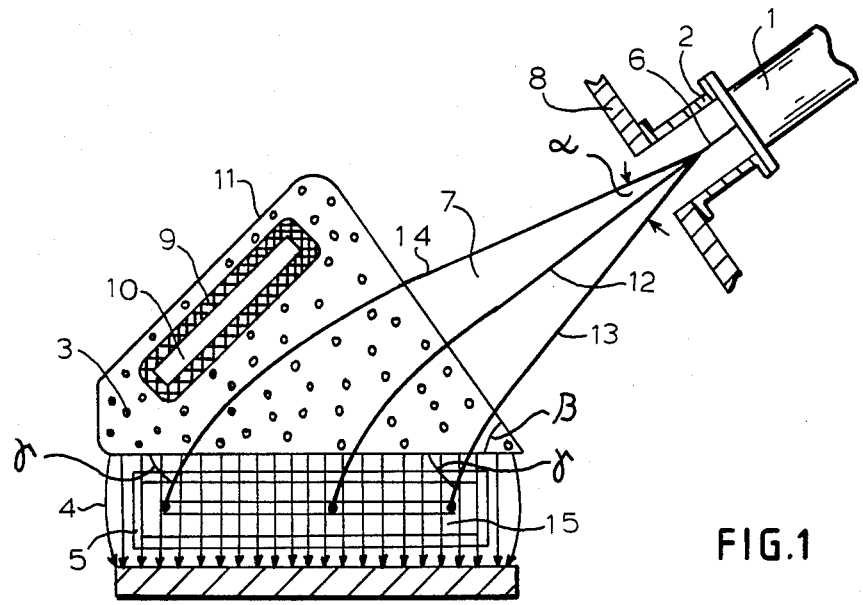
FIG. 1 is a simplified plan view, partially in section, of an embodiment of the apparatus of the invention.

The present invention in its essential part, is based on the concept of creating an arrangement for electron-beam coating which guides the electron beam according to a program in lines across the surface of a large evaporation crucible, in such a way that the electron beam path inside the vapor space is short, and almost equal for all points of the evaporating line. Furthermore, the magnetic field between the evaporation crucible and the strip to be coated shall have a sufficiently high value that all backscattered electrons are deflected and, thus, don't reach the strip to be coated and heat it up.

In accordance with the invention, this is accomplished with an EB gun, a magnetic deflecting system to fan out the beam, and a large evaporation crucible ranging the whole breadth of the strip, and which is bombarded in lines by the electron beam generated inside the EB gun and periodically deflected by means of the deflection system. Additionally, a magnetic sector field is provided that is constant in time with a vertical field direction.

Thus, the emerging beam, substantially horizontal to the evaporant surface, is first formed by the deflection system to include the entire evaporant surface length. Over the crucible the vertical sector field diverts the formed beam onto the evaporant surface.

The magnetic deflecting system provides fan-shaped deflection of the electron beam coming from the axial-type gun, with the main deflection being horizontal (X). A correcting vertical (Y) deflection bends the almost horizontal electron fan. The horizontal beam width of the electron fan, i.e., the maximum a.c. deflection of the electron beam in the X- direction, depends on the breadth of the evaporation crucible to be covered and on the geometry of the sector field. Generally, this ranges from ±5° to ±30°, and preferably ±10° to ±20°. The magnetic deflection system allows both the a.c. deflection and also a superposed d.c. deflection in the X- and Y- directions.

The magnetic sector field is so arranged and has such a field strength that the divergent electron fan entering the horizontal plane will be made almost parallel and can leave the sector field at an arbitrary, almost uniform angle of emergence. The inlet edge of the sector field is so arranged that it is intersected by the central ray of the entering divergent electron fan at almost right angles. This angle between the outlet edge and the inlet edge of the sector field is greater than the half beam width of the electron fan, and the vertex of the sector field lies close to the electron fan so that the one peripheral ray of the electron fan is not deflected essentially and that the angle of emergence to the outlet edge of the sector field amounts to less than 90°. The field strength of the sector field has such a high value that the other peripheral ray of the electron fan is so deflected that it leaves the sector field parallel with the first peripheral ray. The horizontal deflecting field following the sector field is so directed that the field lines are almost vertical to the outlet edge of the sector field. The field strength of the deflecting field has to be set so that the parallel electron fan emerging from the sector field impinges on the evaporating material almost along the central line of the large evaporation crucible. The field strength necessary for it depends on the angle of emergence of the electron fan out of the sector field, and on the height difference between the emerging electron fan and the evaporating material. These two parameters have to be set so that the field strength of the horizontal deflection field necessary for the deflection of the electron fan has such a high value that all electrons backscattered from the evaporator surface can be deflected and prevented from reaching the strip to be coated.

It is useful to add an additional magnetic field, above the horizontal deflection field, to insure that there is no incidence of the backscattered electrons upon the strip to be coated. This additional magnetic field has approximately the direction of the horizontal deflection field, however it has a greater magnetic field strength to guarantee deflection of the backscattered electrons.

The magnetic d.c. and a.c. fields required by the invention are generated in the generally known manner by live coils combined with adapted pole shoes and magnetic back-circuits, to attain the specified field distribution and field strength at a number of ampere-turns that is as low as possible.

The magnetic sector field is formed by two horizontal pole shoe plates from a magnetically soft material interconnected by a magnetically soft yoke where the exciting coil for the sector field is placed. It is advantageous if the distance between the two pole shoe plates is not too large so that penetration of the horizontal deflection field into the sector field does not become too high. On the other side, the distance of the plates has to be so large that the passing electron fan does not warm up the pole shoe plates too much. The most favorable distance ranges between 20 mm and 100 mm, depending on the electron-beam power.

Preferably the outlet edges of the pole shoe plates of the sector field form one pole shoe of the horizontal deflection field. The other pole shoe is a guard plate of a magnetically soft material having approximately the same height and the same length as the outlet edges of the two pole shoe plates, including their interspace. This pole shoe, too, is connected by a magnetically soft yoke with one of the two pole shoe plates or with the magnetic shield. The exciting coil for the horizontal deflection field is placed on this yoke. The evaporation crucible is placed parallel and below or between the large pole shoes of the horizontal deflection field.

Furthermore, it is preferable to arrange the pole shoes of the additional magnetic field above the sector field pole shoes in such a way that they are oriented parallel with the pole shoes of the horizontal deflection field and have a pole shoe distance a little bit greater, so that the vapor spreads out unhampered. Each of the two pole shoes of the additional magnetic field is connected by a magnetically soft yoke with the corresponding pole shoe of the horizontal deflection field placed below. The exciting coils of the additional magnetic field localized on the yokes have been connected in series and are passed by the same electric current.

A further favorable arrangement consists of the following: After optimizing the evaporation system, the magnetically soft yokes with the exciting coils belonging to them can be substituted by permanent magnets remagnetized correspondingly, to do away with the exciting coils and the exciting power circuits. The simplification is especially advantageous for the excitation of the pole shoes of the additional magnetic field.

Operation of the apparatus is as follows: Before the beginning of the evaporation process the incidence line of the electron fan at the evaporating material is adjusted; for this a shielding aperture is swiveled between the arrangement and the strip. Initially, the electron fan is effected by the d.c. Y-deflection at a diminished electron-beam power and a decreased a.c. X-deflection of the magnetic deflection system, to pass the pole shoe plates of the sector field centrally. The central passing can be judged by a visual observation of the luminous phenomenon at the outlet edge of the pole shoe plates. Then the horizontal deflection field is excited in such a way that the incidence line of the electron fan at the evaporating material lies almost centrally between the pole shoes of the horizontal deflection field. Afterwards the electron-beam power and the a.c. X-deflection are enhanced step by step until the electron-beam power required for the evaporation is concentrated in a straight incidence line parallel with the longitudinal axis of the crucible, with a length corresponding with the breadth of the strip to be coated.

After increasing of the a.c. X-amplitude the incidence line first has to be made parallel with the crucible longitudinal axis by variation of the sector field strength and then to be made central by variation of the deflection field strength.

When the electron-beam power has been concentrated in a sufficiently long and accurate incidence line, the transport system for the strip to be coated is switched on and the shielding aperture is swiveled out, so that coating will start.

Figure 2:
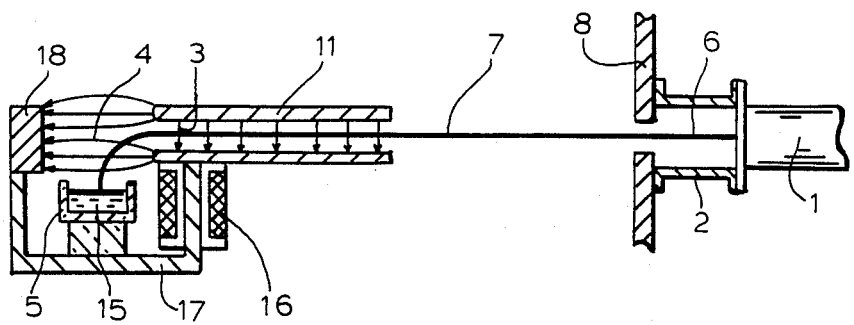
FIG. 2 is a cross-sectional elevation view, taken along line A—A of FIG. 1.

With reference to the drawings, FIGS. 1 and 2 show the arrangement according to the invention, which consists of an axial EB gun 1 placed horizontally, a deflection system 2 for the X-Y- deflection, a magnetic sector field 3 with a vertical field direction, a magnetic deflection field 4 with an almost horizontal field direction, and an evaporation crucible 5 placed horizontally.

Deflection system 2 generates a horizontal (X) a.c. deflection of the electron beam 6. This results in electron fan 7 that can be inclined or deflected by the simultaneous activation of the deflection system 2 by a suitable vertical (Y) a.c. deflection. The EB gun 1 and the deflection system 2 are localized outside the wall of the vacuum chamber 8, while the other units of the apparatus are placed in vacuum.

Vertical sector field 3 is generated with the help of the exciting coil 9 placed outside the electron fan 7 on a magnetically soft yoke 10, between the pole shoe plates 11 of the sector field 3. The inlet edge of the sector field 3 is normal to the central ray 12 of the electron fan 7. One of the peripheral rays 13 of the electron fan 7 runs near the vertex of the sector field 3 and is only little deflected due to its short path inside sector field 3. It leaves the sector field 3 at the angle $\gamma < 90°$ to the outlet edge, if the angle $\beta$ between the outlet edge and the inlet edge of the sector field 3 is greater than the half beam width $\alpha$ of the electron fan 7. The field strength of the sector field 3 is set to such a value that the other peripheral ray 14 of the electron fan 7 leaves the sector field 3 at the same angle $\gamma$ to the outlet edge as the peripheral ray 13. In this case each other electron ray 6, too, of the electron fan 7 leaves the sector field 3 almost at the same angle $\gamma$.

That the electron rays of the electron fan 7 are parellel coming out of the sector field 3 is an essential precondition for deflecting the electron fan 7 evenly in the horizontal deflection field 4 and, thus, for attaining a straight incidence line of the electron fan 7 parallel with the outlet edge of the sector field 3 at the surface of the evaporating material 15 in the crucible 5. Horizontal deflection field 4, directed vertically to the outlet edge of the sector field 3, is generated by the exciting coil 16 (FIG. 2), the magnetically soft yoke 17 and the pole shoe 18 which stands opposite the outlet edges of the pole shoe plates 11 of the sector field 3, parallel and at the same height. The field strength of the horizontal deflection field 4 is set so that the electron fan 7 leaving the sector field 3 horizontally impinges at the surface of the evaporating material 15 almost alongside the central line of the evaporation crucible 5.

Figure 3:
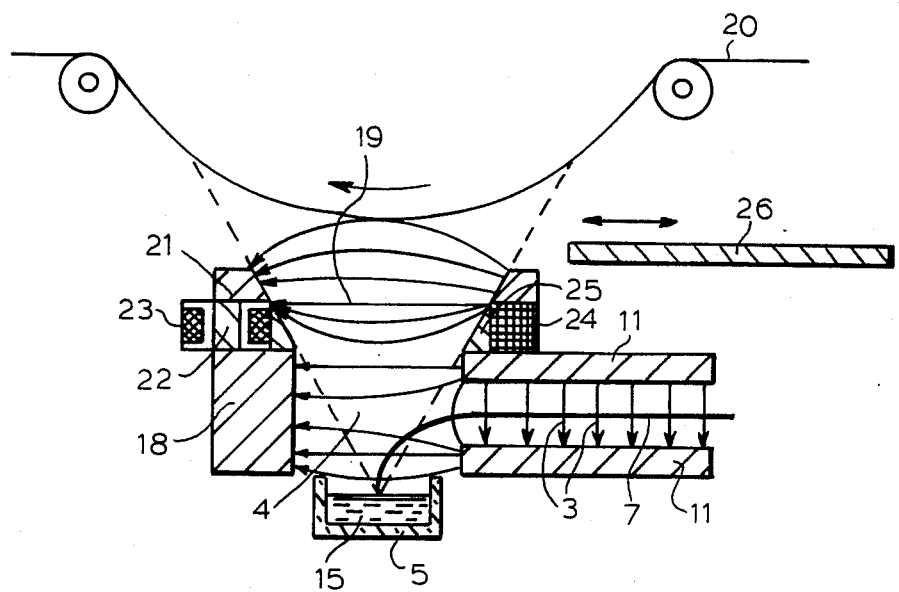
FIG. 3 is a partial cross-sectional elevation view, including magnetic trap, shielding and strip transport elements not shown in FIG. 1 or FIG. 2.

As shown in FIG. 3, an additional magnetic field 19 is placed above the horizontal deflection field 4 to insure that electrons scattered at the surface of the evaporating material 15 or by vapor particles do not reach and heat up the strip 20. This magnetic field 19 has almost the same direction as the horizontal deflection field 4. Magnetically soft yokes 22 with exciting coils 23 or permanent magnets 24 are assembled between the pole shoes 21 of the magnetic field 19 and the pole shoes 18 or the pole shoe plates 11. The field strength inside the space of the additional magnetic field 19 is greater than that inside the space of the horizontal deflection field 4 with this arrangement.

The pole shoes 21 of the additional magnetic field 19 are further apart than pole shoe 18 is from pole shoe plates 11, so that most of the evaporated material is incident on the strip 20 to be coated. Besides, the pole shoes 21 and the non-magnetic vapor shielding 25 for the exciting coils 23 and the permanent magnets 24 are beveled to reduce unwanted vapor deposition at these surfaces. A shielding aperture 26 is located between the pole shoes 21 of the additional magnetic field 19 and the strip to be coated. This is closed during the adjustment of the incidence line of the electron fan 7 at the surface of the evaporating material 15, and is only opened after having adjusted the incidence line, set the desired electron-beam power and switched on the transport system.

Various changes in the details, steps, materials and arrangements of parts, which have been herein described and illustrated in order to explain the nature of the invention, may be made by those skilled in the art within the principle and scope of the invention as defined in the appended claims.

What is claimed is:

1. Apparatus for the electron beam coating of strips comprising:
   a horizontal electron beam gun;
   a first magnetic deflection system adapted to fan the beam at an angle $\alpha$ from said gun;
   an evaporation crucible as long as the breadth of the strip to be coated, said crucible lying below the plane of said fanned beam;
   a second magnetic deflection system for creating a vertical sector field in the path of said beam and adapted to bend same into parallel rays at an approximately constant angle ($\alpha$) as it emerges therefrom adjacent said crucible;
   a third magnetic deflection system for creating a horizontal field over said crucible, and adapted to bend said beam downward into line contact with evaporant along the approximate centerline of said crucible, said third field also acting to deflect backscattered electrons;
   means for transporting a strip of material to be coated above said crucible; and
   vacuum chamber means enclosing said crucible, second and third deflection means and said transporting means.

2. The apparatus as claimed in claim 1, and additionally comprising:
   a fourth magnetic deflection system parallel to and above said third system and adapted to have a higher field strength, whereby essentially all backscattered electrons may be effectively deflected from reaching said strip material.

3. The apparatus as claimed in claim 1, wherein said first deflection means is adapted to fan said beam in the range of $\pm 5°$ to $\pm 30°$.

4. The apparatus as claimed in claim 1, wherein said first deflection means is adapted to fan said beam in the range of $\pm 10°$ to $\pm 20°$.

5. The apparatus as claimed in claim 1, wherein the angle ($\beta$) between the outlet and inlet edges of said sector field is greater than the half-angle ($\frac{1}{2}\alpha$) of said fan.

6. The apparatus as claimed in claim 1, wherein said second deflection system includes two horizontal pole shoe plates having inlet edges and outlet edges, said plates being interconnected with a magnetically soft yoke, and additionally including an exciting coil on said yoke, the distance between said plates being in the range of 20 to 100 mm.

7. The apparatus as claimed in claim 6, wherein the outlet edges of said pole shoe plates form one pole shoe of said third deflection system, said third deflection system also including another pole shoe parallel with and spaced from said outlet edges, a magnetically soft yoke connecting said shoes and including an exciting coil, said evaporation crucible being placed between the pole shoes of said third deflection system.

8. The apparatus as claimed in claim 7, wherein said fourth deflection system includes a pair of pole shoes adjacent to and just above the pole shoes of said third deflection system, each said fourth pole shoe being connected to the underlying third pole shoe with a magnetically soft yoke including an exciting coil.

9. The apparatus as claimed in claim 8, wherein said fourth system pole shoes are beveled at an angle increasing the gap of said third system, whereby evaporation onto said pole shoes is minimized.

10. The apparatus as claimed in claims 6, 7, or 8, and including a permanent magnet instead of at least one of said yoke-exciting coil combinations.

* * * * *